(12) United States Patent
Kessler

(10) Patent No.: US 10,749,521 B2
(45) Date of Patent: Aug. 18, 2020

(54) METHOD FOR IDENTIFYING A CORRECT OPERATION OF AN ELECTRICAL SWITCHING UNIT, COMPUTER PROGRAM PRODUCT FOR EXECUTING SUCH A METHOD, AND FULL BRIDGE CIRCUIT WITH A CONTROL DEVICE FOR EXECUTING SUCH A METHOD

(71) Applicant: Conti Temic Microelectronic GmbH, Nuremberg (DE)

(72) Inventor: Erwin Kessler, Bad Saulgau (DE)

(73) Assignee: Conti Temic Microelectronic GmbH (DE)

( * ) Notice: Subject to any disclaimer, the term of this patent is extended or adjusted under 35 U.S.C. 154(b) by 0 days.

(21) Appl. No.: 16/695,837

(22) Filed: Nov. 26, 2019

(65) Prior Publication Data
US 2020/0177177 A1    Jun. 4, 2020

(30) Foreign Application Priority Data
Dec. 3, 2018  (DE) .......................... 10 2018 220 861

(51) Int. Cl.
*H03K 3/00*      (2006.01)
*H03B 1/00*      (2006.01)
(Continued)

(52) U.S. Cl.
CPC ............. *H03K 17/18* (2013.01); *H03K 17/30* (2013.01)

(58) Field of Classification Search
CPC ...... G11B 5/022; G11B 5/02; H03K 17/0822; H03K 17/64; H03K 17/662; H02P 6/085;
(Continued)

(56) References Cited

U.S. PATENT DOCUMENTS

2016/0329808 A1    11/2016  Han
2018/0076747 A1*   3/2018   Ummelmann .......... H02M 7/42
(Continued)

OTHER PUBLICATIONS

German Examination Report for German Application No. 10 2018 220 861.1, with partial English translation, dated Aug. 5, 2019, 9 pages.

*Primary Examiner* — Anh Q Tra
(74) *Attorney, Agent, or Firm* — RatnerPrestia

(57) ABSTRACT

A method for identifying correct operation of an electrical switching unit, having a full bridge circuit and inductive load operated by the full bridge circuit. The full bridge circuit includes a first semiconductor switching element supplying the inductive load with a first supply voltage potential and a second semiconductor switching element supplying the inductive load with a second supply voltage potential, having a smaller value than the first supply voltage potential. The first and second semiconductor switching element each have a diode. The method determines that the first semiconductor switching element changes from an activated state into a deactivated state, measures a voltage applied to the second semiconductor switching element, compares the measured voltage with a first threshold and detecting that, if the measured voltage on the second semiconductor switching element falls below the second supply voltage potential by the predefined first threshold, the electrical switching unit is operating correctly.

14 Claims, 8 Drawing Sheets

(51) Int. Cl.
*H03K 17/18* (2006.01)
*H03K 17/30* (2006.01)

(58) Field of Classification Search
CPC .......... H02P 7/0044; H02P 6/008; H02P 6/14; H02P 7/28
USPC ................................ 327/110, 112, 423, 587
See application file for complete search history.

(56) References Cited

U.S. PATENT DOCUMENTS

2018/0183364 A1\* 6/2018 Lee ........................... H02P 7/04
2019/0245339 A1\* 8/2019 Chang ..................... H03K 17/00

\* cited by examiner

METHOD FOR IDENTIFYING A CORRECT OPERATION OF AN ELECTRICAL SWITCHING UNIT, COMPUTER PROGRAM PRODUCT FOR EXECUTING SUCH A METHOD, AND FULL BRIDGE CIRCUIT WITH A CONTROL DEVICE FOR EXECUTING SUCH A METHOD

CROSS REFERENCE TO RELATED APPLICATIONS

This application claims priority to German Patent Application No. 10 2018 220 861.1, filed Dec. 3, 2018, the contents of such application being incorporated by reference herein.

FIELD OF THE INVENTION

The present invention relates to a method for identifying a correct operation of an electrical switching unit, in particular an electrical switching unit in a vehicle. The invention further relates to a computer program product for executing such a method and to a full bridge circuit having a control device for executing such a method.

BACKGROUND OF THE INVENTION

Full bridge circuits are commonly arranged in an electrical switching unit and are used, among other things, to operate an inductive load, such as a motor or a solenoid valve.

To ensure that the electrical switching unit has not incurred a fault or a short circuit, which may potentially damage components of the electrical switching unit, it is necessary to check the correct operation of the electrical switching unit.

However, it has been shown that checking the electrical switching unit for correct operation is not always carried out with the required reliability. Thus, it can happen that a fault or short-circuit occurring in the electrical switching unit is not detected as such.

SUMMARY OF THE INVENTION

An aspect of the present invention, therefore, is a method, a computer program product and a full bridge circuit with which the correct operation of an electrical switching unit can be more reliably identified.

According to a first aspect of the present invention, a method is provided for identifying a correct operation of an electrical switching unit, which has a full bridge circuit and an inductive load operated by means of the full bridge circuit. The full bridge circuit comprises a first semiconductor switching element for supplying the inductive load with a first supply voltage potential and a second semiconductor switching element for supplying the inductive load with a second supply voltage potential, which has a smaller value compared to the first supply voltage potential. Furthermore, the first semiconductor switching element and the second semiconductor switching element each have a diode, which can be provided in the form of a substrate diode or as a separate component. The method according to an aspect of the invention comprises the following steps: determining that the first semiconductor switching element changes from an activated state into a deactivated state, measuring a voltage applied to the second semiconductor switching element, comparing the measured voltage with a predefined first threshold value, and identifying that, if the voltage measured on the second semiconductor switching element falls below the second supply voltage potential by the predefined first threshold value, the electrical switching unit is operating correctly.

An aspect of the invention is based on the idea that the correct operation of the electrical switching unit is not monitored during the activated state of the first semiconductor switching element, but during the deactivated phase of the second semiconductor switching element, in particular during the passive freewheeling phase of the second semiconductor switching element. This has the advantage that the monitoring of the correct operation can be carried out reliably even if the activated state of the first semiconductor switching element or the safe through-connection phase of the first semiconductor switching element is comparatively short, thereby complicating a reliable detection of the through-connection phase.

According to a particularly advantageous design of the method according to an aspect of the invention, the step of identifying the correct operation of an electrical switching unit also comprises the following steps: determining a first time at which the first semiconductor switching element changes from the activated state into the deactivated state, determining a second time at which the voltage measured on the second semiconductor switching element falls below the second supply voltage potential by the first threshold value, and identifying the correct operation of the electrical switching unit if the second time occurs within a predetermined duration after the first time. By determining the first and second time, the correct operation of the electrical switching unit can be identified simply and reliably. The above-mentioned predetermined duration can be based on empirical values or modelled values and is usually chosen in such a way that the correct operation of the electrical switching unit is reliably identified.

According to a further preferred embodiment, the correct operation of the electrical switching unit is identified only when the voltage measured on the second semiconductor switching element falls below the second supply voltage potential by the first threshold value for a pre-defined first minimum duration. The fact that the measured voltage must undershoot the second supply voltage potential by the first threshold value for a pre-defined first minimum duration before the correct operation of the electrical switching unit is identified ensures that minor fluctuations in the measured voltage are not identified immediately as faults or the absence of correct operation. This increases the robustness of the method. The first minimum duration can be based on empirical or modelled values and be adjusted to suit the respective application.

According to a further preferred configuration, the method also comprises the following step: allowing a re-activation of the first semiconductor switching element if or once the correct operation of the electrical switching unit has been identified. This ensures that in the case of a correctly operating switching unit the inductive load can continue to be operated correctly by means of the full bridge circuit. However, if a fault were to occur in the electrical control unit, i.e., the method were unable to identify the correct operation of the electrical switching unit, then a reactivation of the first semiconductor switching element would not be allowed, in fact prevented. This ensures that in the event of a non-functional switching unit, damage to the inductive load or other components of the electrical switching unit is prevented at the earliest possible stage.

According to a second aspect of the present invention, a method is provided for identifying a correct operation of an electrical switching unit, which has a full bridge circuit and an inductive load operated by means of the full bridge circuit. The full bridge circuit comprises a first semiconductor switching element for supplying the inductive load with a first supply voltage potential and a second semiconductor switching element for supplying the inductive load with a second supply voltage potential, which has a smaller value compared to the first supply voltage potential. Furthermore, the first semiconductor switching element and the second semiconductor switching element each have a diode, which can be provided in the form of a substrate diode or as a separate component. The method according to an aspect of the invention comprises the following steps: determining that the second semiconductor switching element changes from an activated state into a deactivated state, measuring a voltage applied to the first semiconductor switching element, comparing the measured voltage with a predefined second threshold value and identifying that, if the measured voltage on the first semiconductor switching element falls below the first supply voltage potential by the predefined second threshold value, the electrical switching unit is operating correctly.

By means of the second aspect of the method according to the invention, as is the case due to the first aspect of the method according to the invention the correct operation of the electrical switching unit is identified on the basis of the passive freewheeling phase and not on the basis of the through-connection phase of the respective semiconductor switch element. The method according to the first aspect relates to the case that the first semiconductor switching element changes from the activated state into the deactivated state, wherein the correct operation of the electrical switching unit is then checked on the basis of the passive freewheeling phase of the second semiconductor switching element. The method according to the second aspect, on the other hand, relates to the converse case, whereby the second semiconductor switching element changes from the activated state into the deactivated state and the correct operation of the electrical switching unit is identified based on the passive freewheeling phase of the first semiconductor switching element. In the same way as the method according to the first aspect, the method according to the second aspect also has the advantage that in the case of comparatively short through-connecting phases of the second semiconductor switching element, the correct operation of the electrical control unit can still be reliably identified.

According to a particularly preferred configuration of the method according to the second aspect, the step of identifying the correct operation of the electrical switching unit also has the following steps: determining a first time at which the second semiconductor switching element changes from the activated state into the deactivated state, determining a second time at which the voltage measured on the first semiconductor switching element falls below the first supply voltage potential by the second threshold value, and identifying the correct operation of the electrical switching unit if the second time occurs within a predetermined duration after the first time. In this configuration also, the determination of the first and second times provides a means with which the correct operation of the electrical switching unit can be identified simply and reliably. The predefined duration can again be based on empirical or modelled values.

According to a further preferred embodiment of the method according to the secondary aspect, the correct operation of the electrical switching unit is identified only if the voltage measured on the first semiconductor switching element falls below the first supply voltage potential by the second threshold value for a pre-defined second minimum duration. The fact that the measured voltage must exceed the first supply voltage potential by the second threshold value for a predefined second minimum duration before the correct operation of the electrical switching unit is identified, ensures that minor fluctuations in the measured voltage are not identified immediately as faults or the absence of correct operation. As a result, as in the method in accordance with the first aspect, the robustness of the method is increased. The second minimum duration can, in turn, be based on empirical or modelled values and be adapted to the respective application. The second minimum duration may be the same as or different from the first minimum duration.

According to a further preferred configuration, the method also comprises the following step: allowing a re-activation of the second semiconductor switching element if or once the correct operation of the electrical switching unit has been identified. This ensures that in the case of a correctly operating switching unit the inductive load can continue to be operated correctly by means of the full bridge circuit. However, if a fault were to occur in the electrical control unit, i.e., the method were unable to identify the correct operation of the electrical switching unit, then a reactivation of the second semiconductor switching element would not be allowed, in fact prevented. This ensures that in the event of a non-functional switching unit, damage to the inductive load or other components of the electrical switching unit is prevented at the earliest possible stage.

According to a third aspect of the present invention, a computer program product having at least one computer-readable memory medium with program code instructions which are stored thereon and which are executable by a computer is provided, wherein the program code instructions which are executable by a computer are configured to carry out a method according to the first aspect and/or second aspect and embodiments thereof. The computer-readable memory medium can be designed, for example, as a flash memory.

Finally, according to a fourth aspect of the present invention a full bridge circuit to operate an inductive load is provided. The full bridge circuit comprises a first semiconductor switching element for supplying the inductive load with a first supply voltage potential, and a second semiconductor switching element for supplying the inductive load with a second supply voltage potential, the second supply voltage potential having a lower value compared to the first supply voltage potential and both the first semiconductor switching element and the second semiconductor switching element each having a diode in the form of a substrate diode or a separate component. The full bridge circuit also comprises a control device which is configured to execute a method according to the first aspect and/or the second aspect, as well as embodiments thereof.

Advantageous embodiments of the method according to aspects of the invention can be considered to be advantageous embodiments of the computer program product and of the full bridge circuit.

BRIEF DESCRIPTION OF THE DRAWINGS

Further features and aspects of the present invention will become apparent to a person skilled in the art by practising the present teaching and taking into consideration the accompanying drawings. The drawings show.

Elements of the same design or function are labelled with the same reference symbols across all figures.

DETAILED DESCRIPTION OF THE PREFERRED EMBODIMENTS

Figure 1:
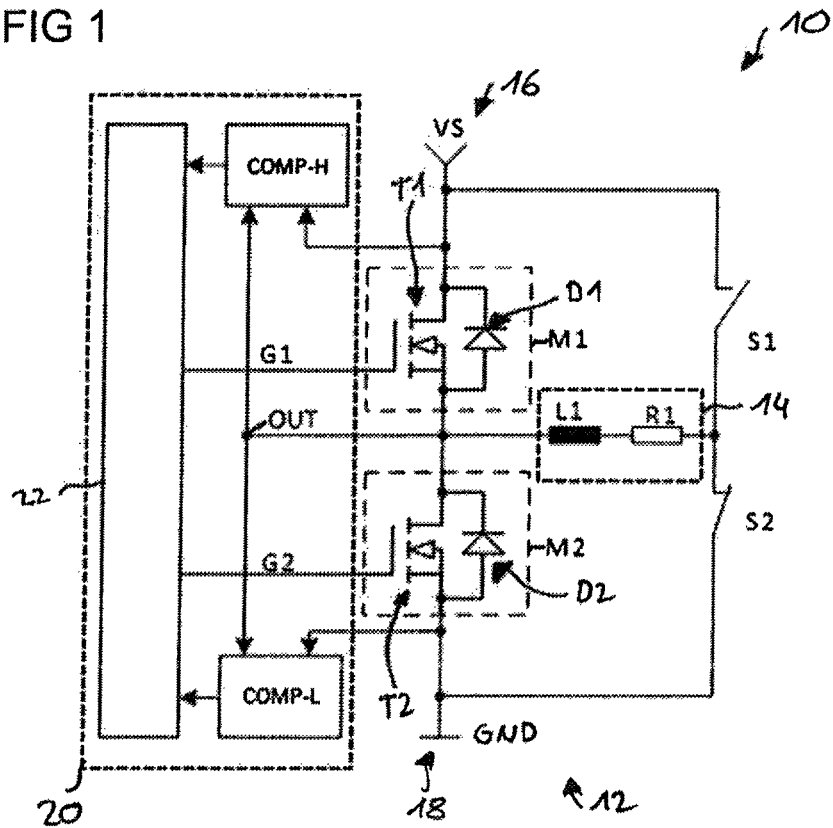
FIG. 1 an electrical switching unit with a full bridge circuit according to an aspect of the invention and an inductive load, FIG. 2 a schematic view of signal characteristics for a switching sequence of a first and second semiconductor switching element of the full bridge circuit of FIG. 1, FIG. 3 a schematic view of a voltage characteristic of a voltage applied to the second semiconductor switching element, FIG. 4 a schematic view of a voltage characteristic of a voltage applied to the first semiconductor switching element, FIG. 5 an embodiment of a method according to the invention, according to the first aspect, FIG. 6 a further embodiment of the method according to the invention, according to the first aspect, FIG. 7 a further embodiment of the method according to the invention, according to the first aspect, FIG. 8 an embodiment of a method according to the invention, according to the second aspect, FIG. 9 a further embodiment of the method according to the invention, according to the second aspect and FIG. 10 a further embodiment of the method according to the invention, according to the second aspect.

Reference is made first to FIG. 1, which shows an electrical switching unit 10 with a full bridge circuit 12 and an inductive load 14. The full bridge circuit 12 has a first semiconductor switching element M1 and a second semiconductor switching element M2. The full bridge circuit 12 also has a first switch S1 and a second switch S2, and an inductive load (represented by a coil L1 and a resistor R1) arranged between the bridge branches. The inductive load 14 can be a motor and, in particular a motor for driving an opening element such as a door or tailgate of a vehicle, or can be a different inductive load such as a solenoid valve, for example.

The first semiconductor switching element M1 is used to supply the inductive load 14 with a first supply voltage potential 16 and the second semiconductor switching element M2 is used to supply the inductive load 14 with a second supply voltage potential 18, the second supply voltage potential 18 having a lower value compared to the first supply voltage potential 16. In the specific example of FIG. 1 the first supply voltage potential is a supply voltage VS, for example, and the second supply voltage potential 18 is ground (or earth) GND, for example.

The semiconductor switching elements M1, M2 switch an output voltage OUT to either the supply voltage VS or to ground GND. The direction of the current through the inductive load 14 is determined by the switches S1, S2, as is known to the person skilled in the art. In the specific example of FIG. 1 the inductive load 14 is terminated to ground by the second switch S2.

As also shown in the specific example of FIG. 1, the first semiconductor switching element M1 and the second semiconductor switching element M2 are each implemented as metal oxide semiconductor field-effect transistors (MOSFETs), which in turn each have a substrate diode D1 or D2 and a transistor T1 or T2. In other embodiments, the semiconductor switching elements M1, M2 can also be implemented as bipolar transistors and the diodes D1, D2 can be implemented as separate components.

The electrical switching unit 10 also has a control device 20 for controlling the semiconductor switching elements M1, M2. The control device 20 comprises a control and evaluation unit 22 and a comparator COMP-H for the first semiconductor switching element M1 and a comparator COMP-L for the second semiconductor switching element M2. The control unit 20 controls the semiconductor switching elements M1, M2 so that the semiconductor switching elements M1, M2 are never in the activated state at the same time, or never conducting at the same time.

Figure 2:
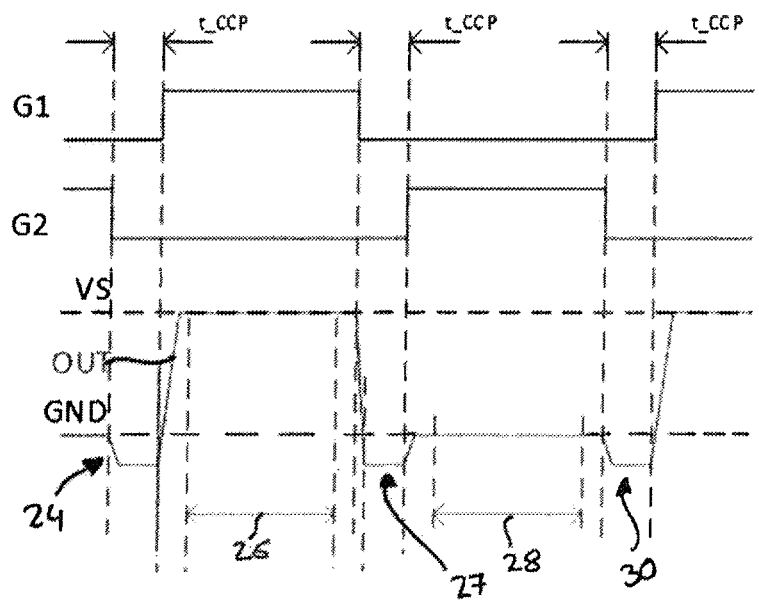

Reference is now made to FIG. 2, which shows a schematic view of signal characteristics for a switching sequence of the first and second semiconductor switching elements M1, M2 of the full bridge circuit 12 of FIG. 1.

Specifically, FIG. 2 shows the control signal G1 for the first semiconductor switching element M1 and the control signal G2 for the second semiconductor switching element M2. During the time interval t_CCP the two control signals G1, G2 are set to LOW, which means that during this time both semiconductor switching elements M1, M2 are turned off or in the deactivated state.

If current now already flows through the inductive load 14, in the phase in which the two semiconductor switching elements M1, M2 are turned off the current continues to flow through the substrate diodes D1, D2. Since in this specific example the inductive load 14 is terminated to ground (second switch S2 is in the closed state), in the phase in which both semiconductor switching elements M1, M2 are turned off, a current flows through the substrate diode D2 of the second semiconductor switching element M2. In this so-called passive freewheeling phase the output voltage OUT thus falls below the second supply voltage potential 18, that is to say, in the specific case below GND. This is shown schematically in FIG. 2 by the "hump" 24.

If the first semiconductor switching element M1 now switches from the deactivated state into the activated state, for example by the control signal G1 switching to HIGH, the output voltage OUT rises to the value VS. As a result of system-related processes, however, the output voltage OUT does not change instantaneously from GND to VS. Instead, it takes a certain time until the output voltage OUT reaches the value VS, as is known to the person skilled in the art. Not until the output voltage OUT has reached the value VS is it possible to speak of a safe "through-connection" of the first semiconductor switching element M1. The phase of the safe through connection of the first semiconductor switching element M1 is marked schematically by the arrow 26.

If the first semiconductor switching element M1 is now turned off again by the control signal G1 switching to LOW, essentially the already described passive freewheeling occurs at the second semiconductor switching element M2 (represented by the "hump" 27), so that the output voltage OUT falls to a value below GND again.

If in the deactivated state of the first semiconductor switching element M1 the second semiconductor switching element M2 switches from the deactivated state into the activated state (for example, by the control signal G2 switching to HIGH), the output voltage OUT rises to the value GND. Due to the system-related processes described, it again takes a certain time until the output voltage OUT reaches the value GND. Not until the output voltage OUT has reached the value GND, is it again possible to speak of a safe "through connection" of the second semiconductor switching element M2. The phase of the safe through connection of the second semiconductor switching element M2 is marked schematically by the arrow 28.

If the second semiconductor switching element M2 is then turned off, for example by the control signal G2 switching to LOW, and in this switching phase the coil L1 still has energy stored in the magnetic field, the output voltage OUT again falls to a value below GND. The consequence of this is that even in this switching phase a "hump" (represented by the arrow 30) occurs.

To determine the correct operation of the electrical switching unit 10, in the prior art up to now a voltage drop across the semiconductor switching elements M1, M2 during the safe through-connection phases 26, 28 has been used. However, it has been shown that it is not always possible to determine the safe through-connection phases 26, 28 correctly, depending on the particular application. In particular, if the on phases of the semiconductor switching elements M1, M2 become very short, for example due to a pulse-width modulated control of the inductive load 14, the safe through-connection phase 26, 28 can become so short that it essentially vanishes. If a short circuit were to occur in this case, with the methods used in the prior art up to now this would not be detectable or identifiable.

Figure 3:
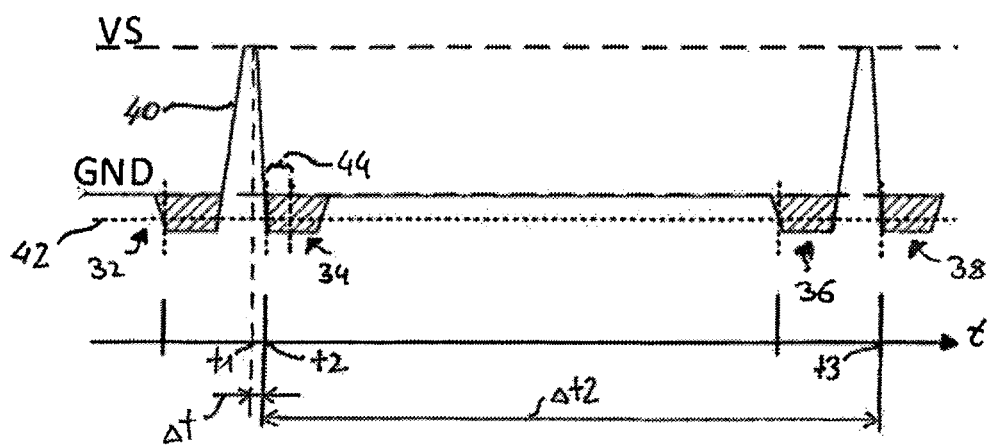

Referring now to FIG. 3, this shows a schematic view of a voltage characteristic of a voltage 40 applied to the second semiconductor switching element M2.

As already mentioned in connection with FIG. 2, in the case in which the first semiconductor switching element M1 switches from the activated state into the deactivated state the voltage 40 applied to the second semiconductor switching element M2 falls to a value below GND. This is shown by the "humps" 32-38.

The idea of an aspect of the present invention then involves identifying the correct operation of the electrical switching unit 10 not on the basis of the through-connection phases of the first semiconductor switching element M1, but instead on the basis of the "humps" 32-38, which means on the basis of the passive freewheeling of the second semiconductor switching element M2.

In concrete terms, the correct operation may be identified by the fact that the voltage 40 measured on the second semiconductor switching element M2 falls below a value of GND by a predefined first threshold value 42. As long as the measured voltage 40 is below GND by the first threshold 42, it can be assumed that the electrical switching unit 10 is fully operational. If the measured voltage 40 were not to fall below GND by the first threshold 42, then it would no longer be possible to assume the correct operation of the electrical switching unit and a fault or short circuit in the electrical switching unit 10 would have to be assumed. Because the passive freewheeling ("humps" 32-38) also occurs when the safe through-connection phase of the first semiconductor switching element M1 is very short, or in some cases even "disappears", then even for very short through-connection phases of the first semiconductor switching element M1 the correct operation of the electrical switching unit 10 can be reliably identified.

The correct operation of the electrical switching unit 10 can be identified, for example, by the fact that a first time t1 is identified, at which the first semiconductor switching element M1 changes from the activated state into the deactivated state. Furthermore, a second time t2 can be determined, at which the measured voltage 40 is below GND by the first threshold 42. If the second time occurs within a predetermined duration Δt after the first time, it can be assumed that the electrical switching unit 10 is operating correctly. The predetermined duration Δt or the temporal interval between the first time t1 and the second time t2 can be estimated, for example, from empirical or modelled values.

In order to make the method more robust, a first minimum period 44 can also be introduced, for which the measured voltage 40 must remain below GND by the first threshold value 42 before a correct operation of the electrical switching unit 10 is assumed. The first minimum duration 44 allows even minor fluctuations of the measured voltage 40 not to be immediately evaluated as faults in the electrical switching unit 10. The first minimum duration 44 can again be based on empirical or modelled values.

As also shown in FIG. 3, during the subsequent switching cycle of the first semiconductor switching element M1 or after the repeated deactivation of the first semiconductor switching element M1 the passive freewheeling of the second semiconductor switching element M2 occurs again. Even if in this passive freewheeling phase the electrical switching unit 10 is correctly operational, the measured voltage 40 on the second semiconductor switching element M2 then falls again to a value which is below GND by the first threshold value 42. A third time t3 can therefore be determined, at which in the following switching cycle or after a subsequent repeated deactivation of the first semiconductor switching element M1 the measured voltage 40 falls below GND by the first threshold value 42. If the third time t3 now occurs within a predetermined duration Δt2 after the second time t2, it can be assumed that the electrical switching unit 10 is operating correctly. This variant of the detection of the correct operation of the electrical switching unit 10 is particularly advantageous when the inductive load 14 is activated by means of a pulse-width modulated signal. In that case the predetermined duration Δt2 can then be selected as a function of a duration of the period of the pulse-width modulated signal. If the third time t3 does not occur within a period-duration dependent time interval (for example, period duration*110%) after the second time t2, it can be assumed that the electrical switching unit 10 is no longer functioning correctly and instead, a fault or short circuit has occurred in the electrical switching unit 10.

The times t1, t2 and t3 can be provided by means of a trigger signal, so that the calculation of the durations Δt1 and Δt2 requires little computational effort.

Figure 4:
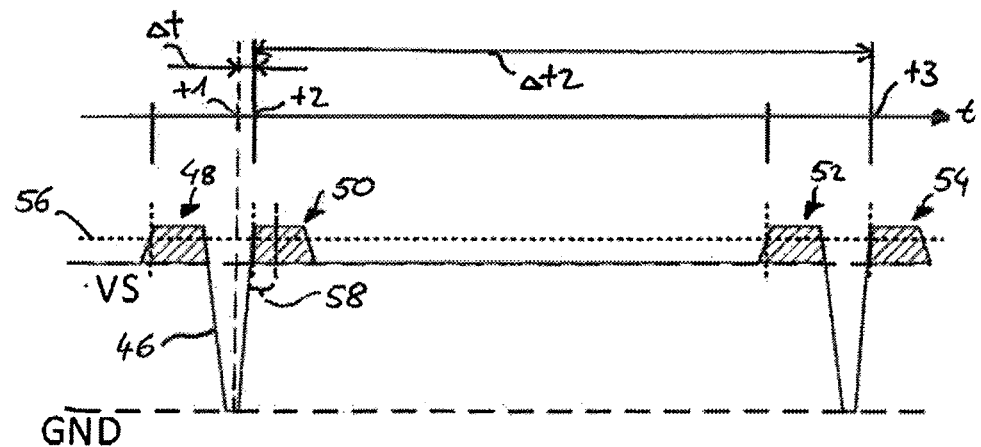

Referring now to FIG. 4, this shows a schematic view of a voltage characteristic of a voltage 46 applied to the first semiconductor switching element M1.

As can be seen, in the case of a change of the second semiconductor switching element M2 from the activated state into the deactivated state the voltage 46 applied to the first semiconductor switching element M1 rises to a value above VS. Again, this is shown by the "humps" 48-54.

The idea of an aspect of the present invention then is that even in such a case the correct operation of the electrical switching unit 10 is not identified on the basis of the safe through-connection phases of the second semiconductor switching element M2, but on the basis of the "humps" 48-54, that is to say, on the basis of the passive freewheeling of the first semiconductor switching element M1.

In concrete terms, the correct operation can be identified by the fact that the voltage 46 measured on the first semiconductor switching element M1 exceeds a value of VS by a predefined second threshold value 56. As long as the measured voltage 46 is above VS by the second threshold value 56, it can be assumed that the electrical switching unit 10 is fully operational. If the measured voltage 46 were not above VS by the second threshold 56, then the correct operation of the electrical switching unit 10 can no longer be assumed and a fault or short circuit in the electrical switching unit 10 would have to be assumed. Because the passive freewheeling ("humps" 48-54) also occurs when the safe through-connection phase of the second semiconductor switching element M2 is very short, or in some cases even "disappears", then even for very short through-connection phases of the second semiconductor switching element M2 the correct operation of the electrical switching unit 10 can be reliably identified.

The correct operation of the electrical switching unit 10 can be identified, for example, by the fact that a first time t1 is again identified, at which the second semiconductor switching element M2 changes from the activated state into the deactivated state. Furthermore, a second time t2 can be determined, at which the measured voltage 46 is above VS by the second threshold 56. If the second time occurs within a predetermined duration Δt after the first time, it can be assumed that the electrical switching unit 10 is operating correctly. The predetermined duration Δt or the temporal interval between the first time t1 and the second time t2 can again be estimated, for example, using empirical or modelled values.

In order to make the method more robust, a second minimum period 58 can also be introduced, for which the measured voltage 46 must remain above VS by the second threshold value 56 before a correct operation of the electrical switching unit 10 can be assumed. Like the first minimum duration 44, the second minimum duration 58 also allows minor fluctuations of the measured voltage 46 not to be immediately evaluated as faults in the electrical switching unit 10. The second minimum duration 58 can also be based on empirical or modelled values.

As also shown in FIG. 4, during the subsequent switching cycle of the second semiconductor switching element M2 or after the repeated deactivation of the first semiconductor switching element M2, the passive freewheeling of the first semiconductor switching element M1 occurs again. Even if in this passive freewheeling phase the electrical switching unit 10 is correctly operational, the measured voltage 46 on the first semiconductor switching element M1 then rises to a value which is above VS by the second threshold value 56. A third time t3 can therefore be determined, at which in the following switching cycle or after a subsequent repeated deactivation of the second semiconductor switching element M2 the measured voltage 46 is above VS by the second threshold value 56. If the third time t3 now occurs within a predetermined duration Δt2 after the second time t2, it can be assumed that the electrical switching unit 10 is operating correctly. As in the case of FIG. 3 also, this variant of the identification of the correct operation of the electrical switching unit 10 is particularly advantageous when the inductive load 14 is activated by means of a pulse-width modulated signal. The predetermined duration Δt2 can then be selected as a function of a duration of the period of the pulse-width modulated signal. If the third time t3 does not occur within a period-duration dependent time interval (for example, period duration*110%) after the second time t2, it can be assumed that the electrical switching unit 10 is no longer functioning correctly and instead, a fault has occurred in the electrical switching unit 10.

The times t1, t2 and t3, as in the case of FIG. 3, can be provided by means of a trigger signal, so that the calculation of the durations Δt1 and Δt2 requires little computational effort.

Figure 5:
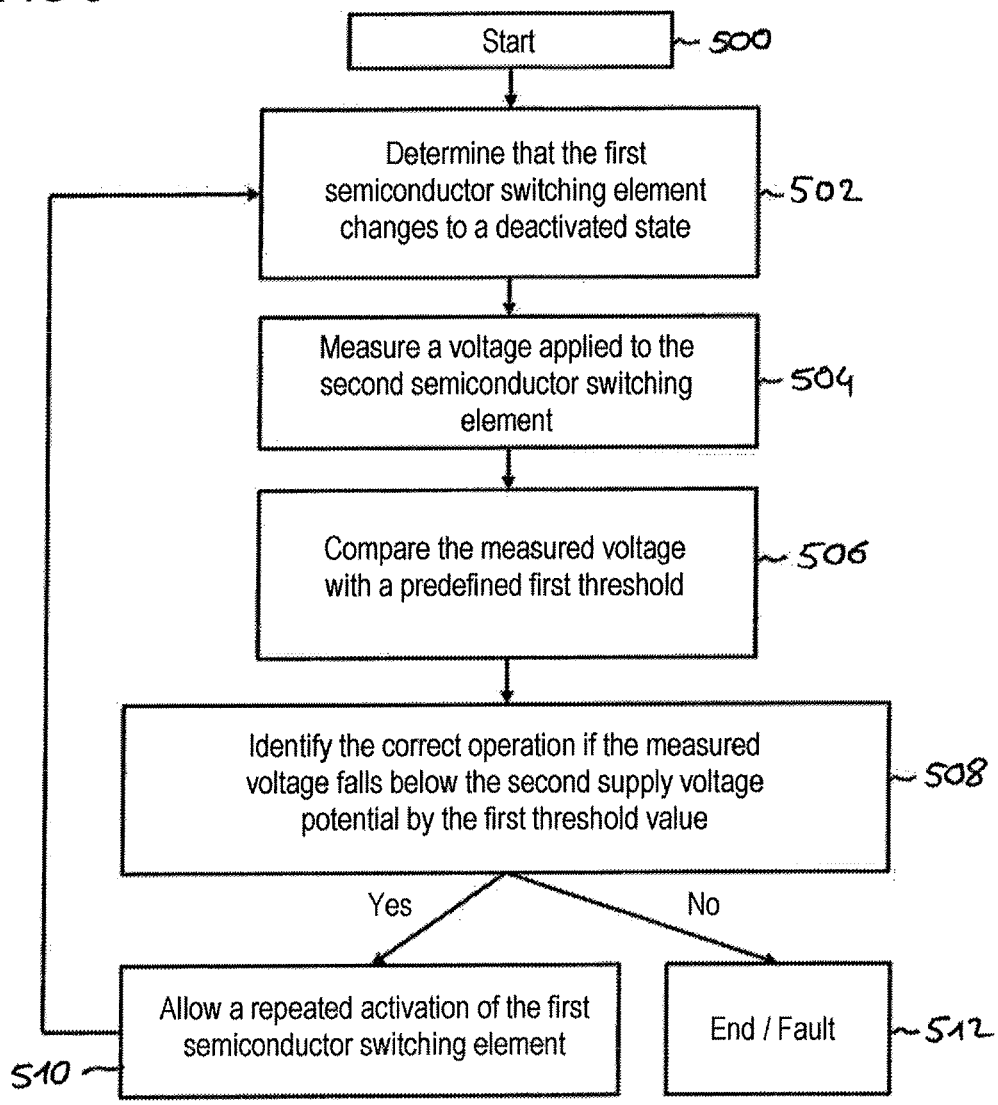

Reference is now made to FIG. 5, which shows an embodiment of a method according to an aspect of the invention. In the method described under FIG. 5, the correct operation of the electrical switching unit 10 is identified on the basis of the passive freewheeling phase of the second semiconductor switching device M2. The method according to FIG. 5 therefore takes into account a voltage characteristic, such as that shown in FIG. 3, for example. In the following the individual steps of the method are described in detail in connection with FIGS. 1 to 3.

The method begins with the start at step 500. In the subsequent step 502 it is determined that the first semiconductor switching element M1 changes from an activated state into a deactivated state. In the following step 504 a voltage applied to the second semiconductor switching element M2 (for example, voltage 40 of FIG. 3) is determined. In the following step 506, the measured voltage 40 is compared with a predefined first threshold (for example, threshold 42 of FIG. 3). The comparison is carried out, for example, with the comparator COMP-L (see FIG. 1). In the following step 508, the correct operation of the electrical switching unit 10 is then identified if the measured voltage 40 is below the second supply voltage potential 18 by the first threshold 42 (in the specific example GND).

If in step 508 the correct operation of the electrical switching unit 10 were identified, then in a step 510 the repeated activation of the first semiconductor switching element M1 would be allowed, so that the method jumps back again to step 502, in which it is determined once again whether the first semiconductor switching element M1 in turn changes from the activated state into the deactivated state. In the event that the first semiconductor switching element M1 changes once again into the deactivated state, the previously described steps 504 to 508 are executed again until the correct operation of the electrical switching unit 10 is no longer identified. In this case, the method jumps back to step 512, in which the method detects or outputs a fault and/or terminates.

Figure 6:
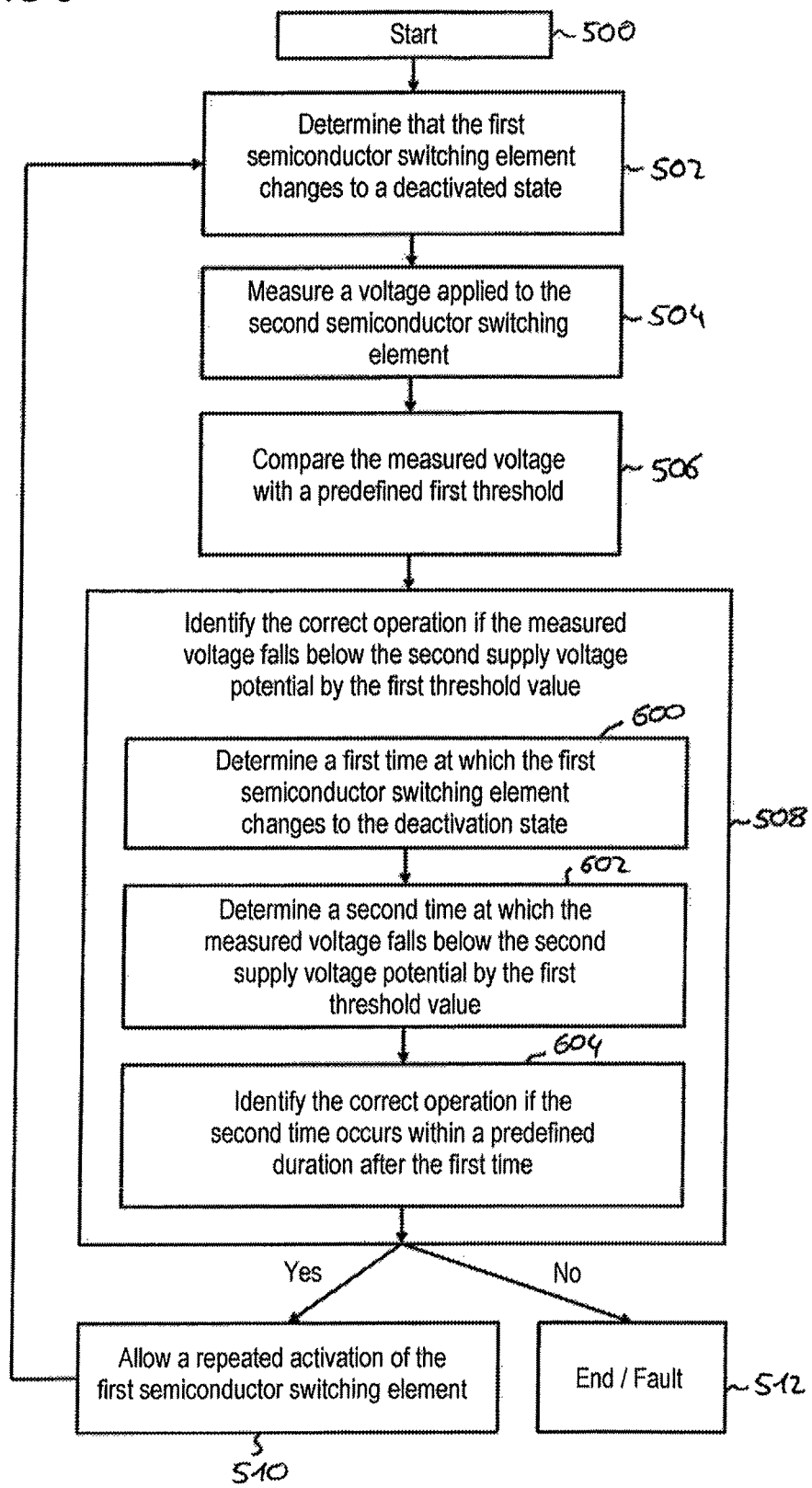

Reference is now made to FIG. 6 which shows an embodiment of the method of FIG. 5. The method in accordance with FIG. 6 like the method according to FIG. 5 also has the steps 500 to 512. In contrast to the method of FIG. 5, however, in the method of FIG. 6 the correct operation (step 508) is identified by means of the following steps. First, in a step 600 a first time (for example, time t1 of FIG. 3) is determined, at which the first semiconductor switching element M1 changes from the activated state into the deactivated state. Then, in step 602, a second time (for example, time t2 of FIG. 3) is determined at which the measured voltage 40 falls below the second supply voltage potential 18 (in the specific example, GND) by the first threshold value 42. Then, in step 604 the correct operation of the electrical switching unit 10 is identified if the second time t2 occurs within a predetermined duration (for example duration Δt of FIG. 3) after the first time t1. In this embodiment, the correct operation of the electrical switching unit 10 can be identified or detected by a simple temporal comparison of two times t1, t2. If the second time t2 were then to occur within the duration Δt after the first time t1, then the method would confirm the correct operation of the electrical switching unit 10 and jump to step 510. In the other case, the method would jump to step 512.

Figure 7:
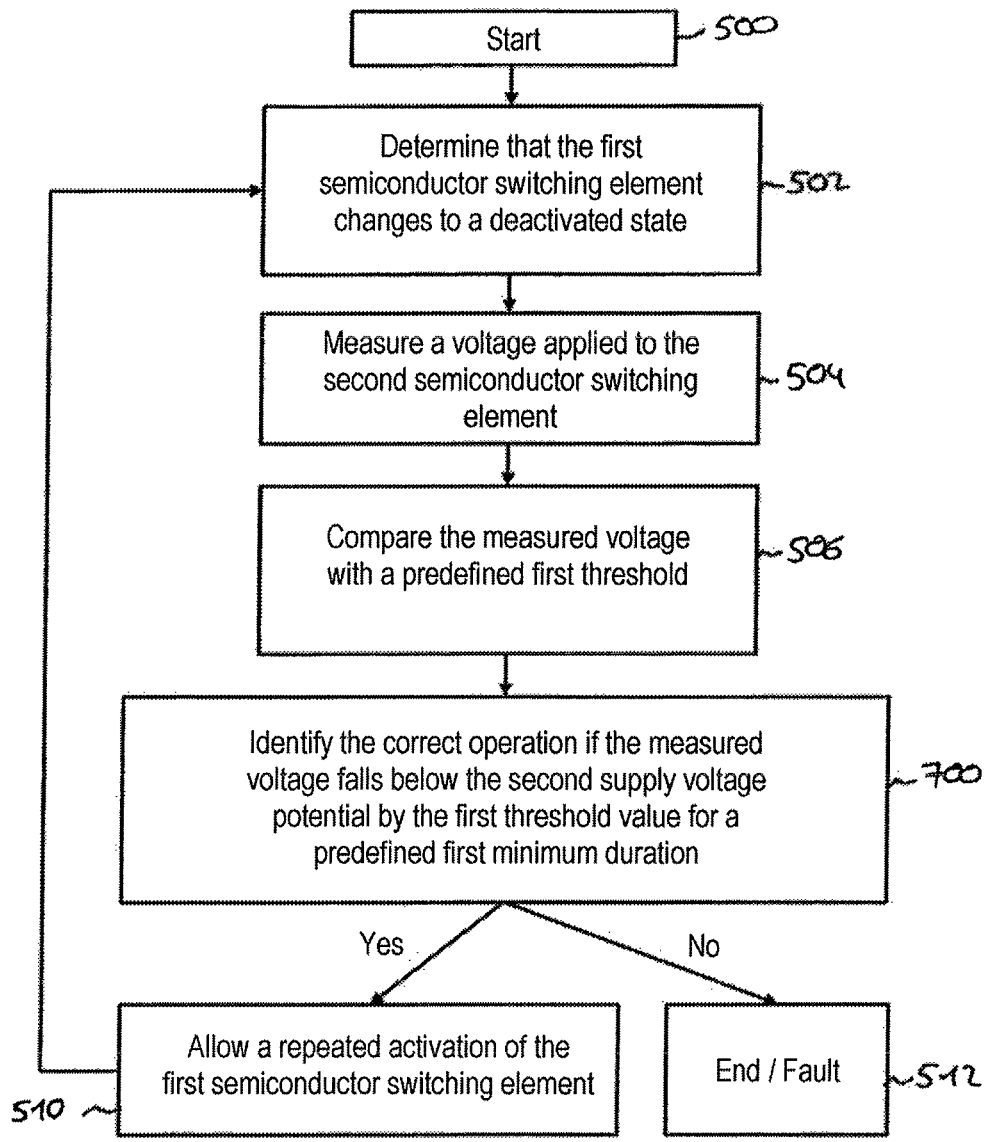

Reference is now made to FIG. 7 which shows another embodiment of the method according to FIG. 5. The method according to FIG. 7 again comprises the steps 500 to 506, and the steps 510 and 512. In the method according to FIG. 7, however, in a step 700 the correct operation is detected not only based on the fact that the measured voltage 40 falls below the second supply voltage potential 18 (in the specific example, GND) by the first threshold value 42. But it must also be ensured that the measured voltage 40 falls below the second supply voltage potential 18 by the first threshold value 42 for a predetermined first minimum duration (for example, minimum duration 44 of FIG. 3). As mentioned, the minimum duration 44 increases the robustness of the method.

If in step 700 the correct operation is then identified, the method then jumps to step 510. In the other case, the method jumps to step 512, in which a fault is detected and/or output, or the method is terminated.

Of course it is possible to combine the embodiments of the method according to FIGS. 5 to 7 in any desired way.

Figure 8:
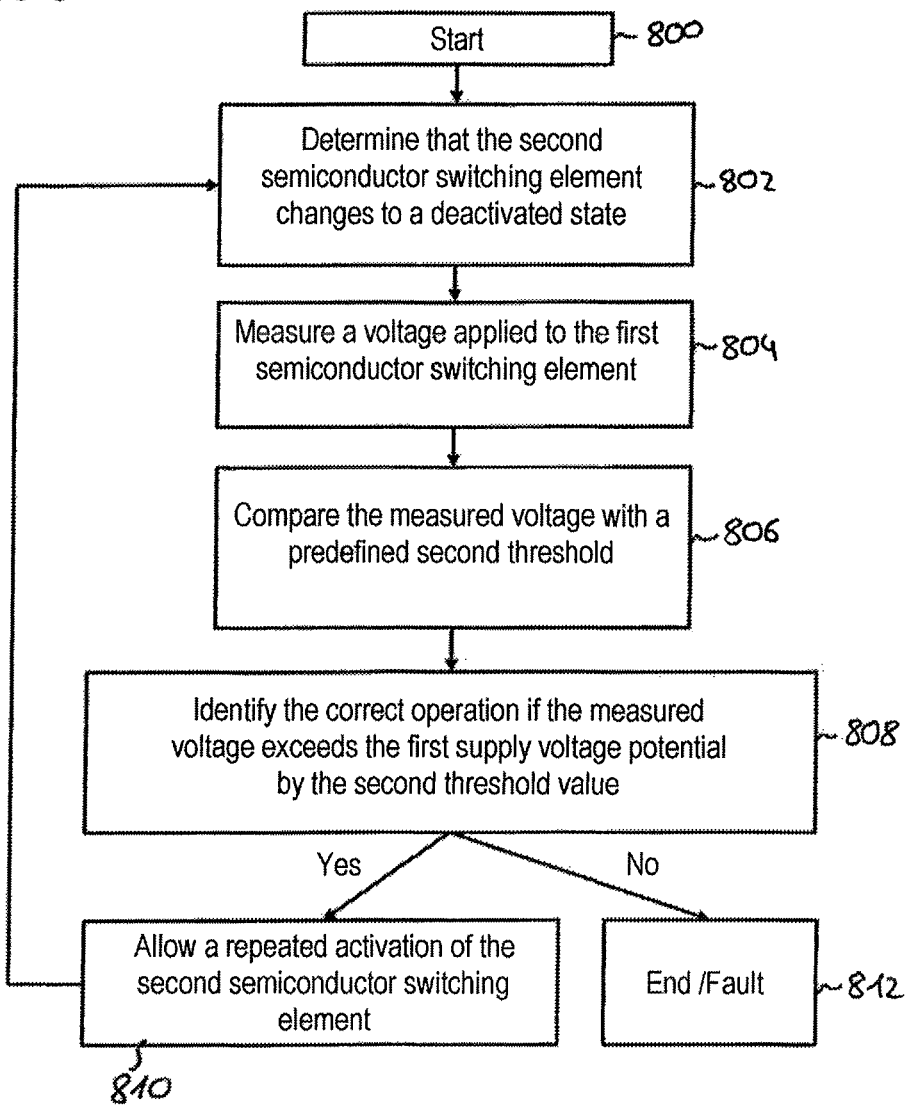

Reference is now made to FIG. 8, which shows another embodiment of a method according to an aspect of the invention. In contrast to the methods referred to in FIGS. 5 to 7, in the method according to FIG. 8 the correct operation of the electrical switching unit 10 is identified on the basis of the passive freewheeling phase of the first semiconductor switching element M1. The method according to FIG. 8 therefore takes into account a voltage characteristic, such as that shown in FIG. 4, for example. In the following the individual steps of the method are described in detail in connection with FIGS. 1 to 2 and 4.

The method begins with the start at step 800. In the subsequent step 802 it is determined that the second semiconductor switching element M2 changes from an activated state into a deactivated state. In the following step 804 a voltage applied to the first semiconductor switching element M1 (for example, voltage 46 of FIG. 4) is determined. In the following step 806, the measured voltage 46 is compared with a predefined second threshold value (for example, threshold 56 of FIG. 4). The comparison is carried out, for example, with the comparator COMP-H (see FIG. 1). In the following step 808, the correct operation of the electrical switching unit 10 is identified if the measured voltage 46 is above the first supply voltage potential 16 by the second threshold value 56 (in the specific example VS).

If in step 808 the correct operation of the electrical switching unit 10 were identified, then in a step 810 the repeated activation of the second semiconductor switching element M2 would be allowed, so that the method jumps back to step 802, in which it is determined once again whether the second semiconductor switching element M2 in turn changes from the activated state into the deactivated state. In the event that the second semiconductor switching element M2 changes once again into the deactivated state, the previously described steps 804 to 808 are executed again until the correct operation of the electrical switching unit 10 is no longer identified. In this case, the method jumps back to step 812, in which the method detects or outputs a fault and/or terminates.

Figure 9:
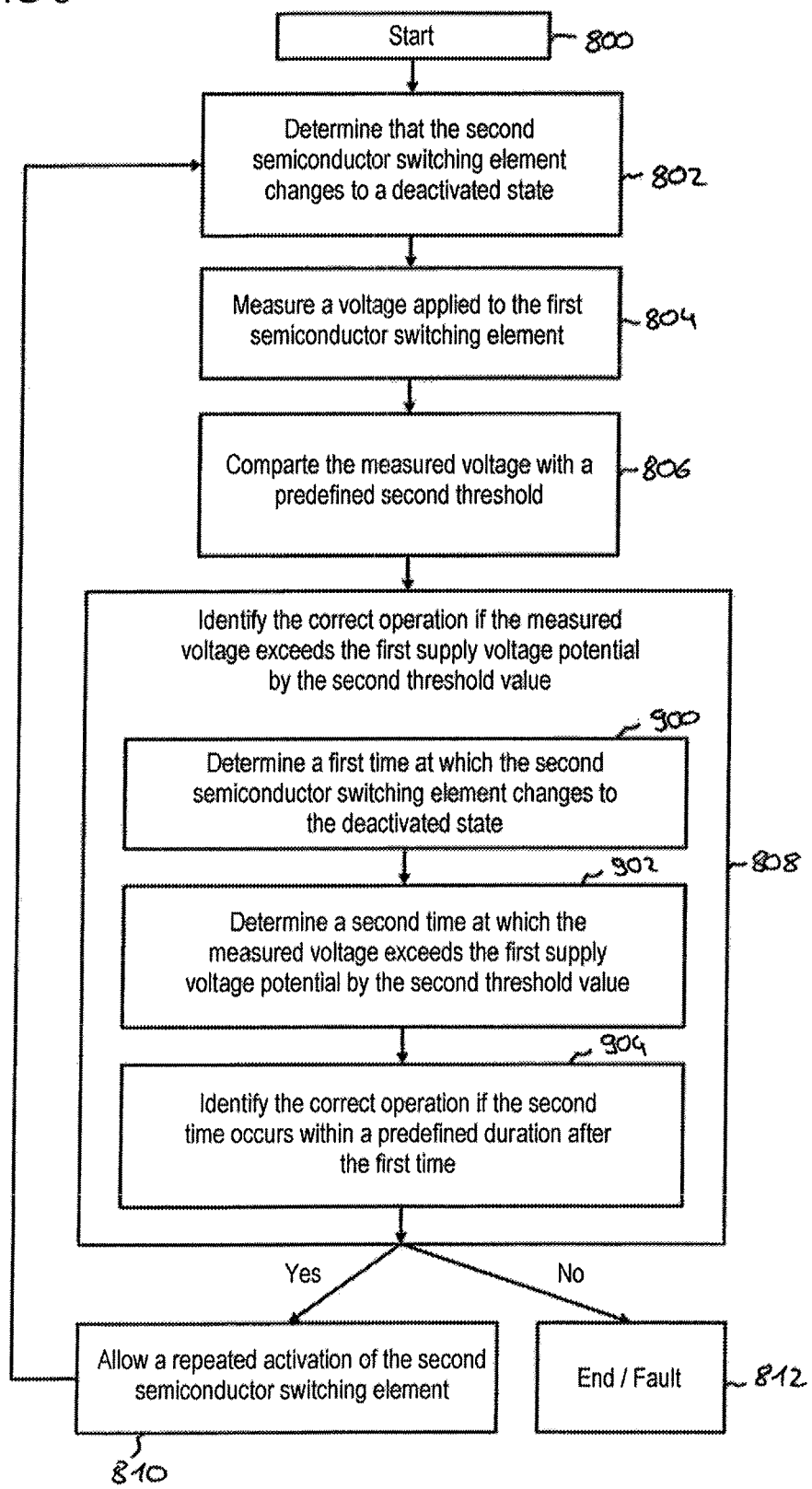

Reference is now made to FIG. 9 which shows an embodiment of the method of FIG. 8. The method in accordance with FIG. 9 like the method according to FIG. 8 also has the steps 800 to 812. In contrast to the method of FIG. 8, however, in the method of FIG. 9 the correct operation (step 808) is identified by means of the following steps. First, in a step 900 a first time (for example, time t1 of FIG. 4) is determined, at which the second semiconductor switching element M2 changes from the activated state into the deactivated state. Then, in step 902, a second time (for example, time t2 of FIG. 4) is determined at which the measured voltage 46 exceeds the first supply voltage potential 16 (in the specific example, VS) by the second threshold value 56. Then, in step 904 the correct operation of the electrical switching unit 10 is identified if the second time t2 occurs within a predefined duration (for example duration Δt of FIG. 4) after the first time t1. In this embodiment, the correct operation of the electrical switching unit 10 can be identified or detected by a simple temporal comparison of two times t1, t2. If the second time t2 were then to occur within the duration Δt after the first time t1, then the method would confirm the correct operation of the electrical switching unit 10 and jump to step 810. In the other case, the method would jump to step 812.

Figure 10:
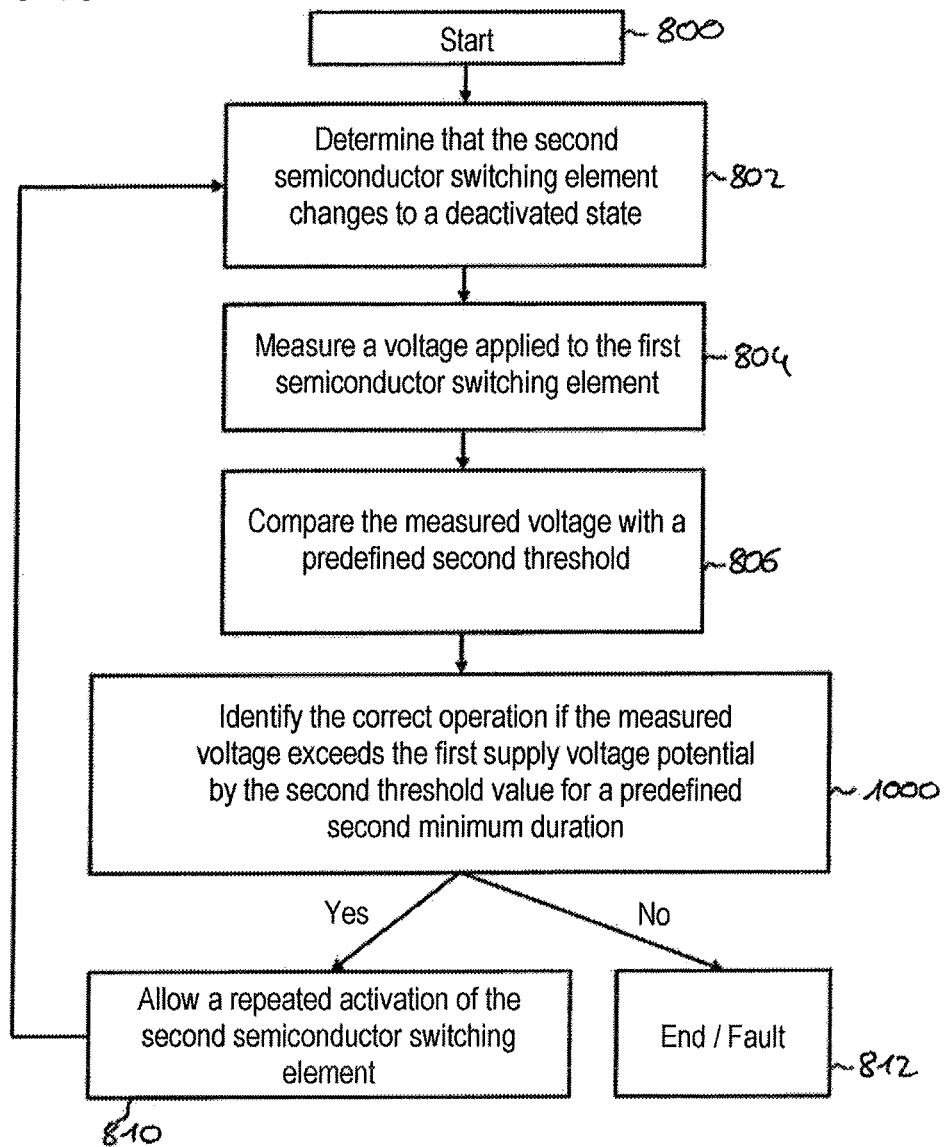

Reference is now made to FIG. 10 which shows another embodiment of the method according to FIG. 8. The exemplary embodiment according to FIG. 10 again comprises the steps 800 to 806, and the steps 810 and 812. In the method according to FIG. 10, however, in a step 1000 the correct operation is identified not only based on the fact that the measured voltage 46 exceeds the first supply voltage potential 16 (in the specific example, VS) by the second threshold value 56. But it must also be ensured that the measured voltage 46 exceeds the first supply voltage potential 16 by the second threshold value 56 for a predetermined second minimum duration (for example, minimum duration 58 of FIG. 4). As mentioned, the minimum duration 58 increases the robustness of the method.

If in step 1000 the correct operation is then identified, the method then jumps to step 810. In the other case, the method jumps to step 812, in which a fault is detected and/or output, or the method is terminated.

Of course it is possible to combine the embodiments of the method according to FIGS. 8 to 10 in any desired way.

It is also possible to combine the methods referred to in FIGS. 5 to 7 with the methods referred to in FIGS. 8 to 10 in an appropriate manner, so that the corresponding method (in accordance with FIGS. 5 to 7 or in accordance with FIGS. 8 to 10) is always applied when the corresponding first or second semiconductor switching element M1, M2 changes from the activated state to the deactivated state.

The control device 20 is designed to carry out the steps of the methods according to FIGS. 5 to 10. The methods according to FIGS. 5 to 10 can be implemented, for example, as a computer program product on the control device 20.

In addition, the methods disclosed here in connection with FIGS. 5 to 10 can be combined with the methods known from the prior art to identify the correct functioning of the electrical switching unit 10. For example, in sufficiently long switched-on phases of the semiconductor switching elements M1, M2, the correct operation could be identified on the basis of the monitoring of the safe through-connection phase known from the prior art, and in relatively short switched-on phases the correct operation could be identified on the basis of the methods according to aspects of the invention, that is on the basis of the monitoring of the passive freewheeling phase. It is also possible according to an aspect of the invention to provide the monitoring of the passive freewheeling phase as an additional safeguard for monitoring the safe through-connection phase, in particular in comparatively short switched-on phases of the semiconductor switching elements M1, M2.

The invention claimed is:

1. A method for identifying a correct operation of an electrical switching unit, which has a full bridge circuit and an inductive load operated by the full bridge circuit, the full bridge circuit comprising a first semiconductor switching element connected to the inductive load and configured to supply the inductive load with a first supply voltage potential and a second semiconductor switching element connected to the inductive load and configured to supply the inductive load with a second supply voltage potential which has a lower value than the first supply voltage potential, wherein the first semiconductor switching element and the second semiconductor switching element each have a respective diode, wherein a controller is connected to the inductive load, connected to the first supply voltage potential and connected to the second supply voltage potential, and wherein the method comprises:

determining, by the controller, that the first semiconductor switching element changes from an activated state into a deactivated state;

in response to the determined change from the activated state to the deactivated state:

measuring, by the controller, a voltage applied to the second semiconductor switching element at the connection to the inductive load;

comparing, by the controller, the measured voltage to a predefined first threshold value less than the second supply voltage potential; and identifying, by the controller, that, the electrical switching unit is operating correctly, when the measured voltage on the second semiconductor switching element falls below the second supply voltage potential by the predefined first threshold value.

2. The method as claimed in claim 1, wherein the step of identifying the correct operation of the electrical switching unit also comprises:

determining a first time at which the first semiconductor switching element changes from the activated state into the deactivated state, determining a second time at which the voltage measured on the second semiconductor switching element falls below the second supply voltage potential by the first threshold value, and identifying the correct operation of the electrical switching unit if the second time occurs within a predetermined duration after the first time.

3. The method as claimed in claim 1, wherein the correct operation of the electrical switching unit is only identified if the voltage measured on the second semiconductor switching element falls below the second supply voltage potential by the first threshold value for a pre-defined first minimum duration.

4. The method as claimed in claim 1, further comprising:

allowing a re-activation of the first semiconductor switching element if the correct operation of the electrical switching unit has been identified.

5. A method for identifying a correct operation of an electrical switching unit, which has a full bridge circuit and an inductive load operated by the full bridge circuit, the full bridge circuit comprising a first semiconductor switching element connected to the inductive load and configured to supply the inductive load with a first supply voltage potential and a second semiconductor switching element connected to the inductive load and configured to supply the inductive load with a second supply voltage potential which has a lower value than the first supply voltage potential, wherein the first semiconductor switching element and the second semiconductor switching element each have a respective diode, wherein a controller is connected to the inductive load, connected to the first supply voltage potential and connected to the second supply voltage potential, and wherein the method comprises:

determining, by the controller, that the second semiconductor switching element changes from an activated state into a deactivated state;

in response to the determined change from the activated state to the deactivated state:

measuring, by the controller, a voltage applied to the first semiconductor switching element at the connection to the inductive load, comparing, by the controller, the measured voltage to a predefined second threshold value less than the second supply voltage potential, and identifying, by the controller, that, the electrical switching unit is operating correctly, when the measured voltage on the first semiconductor switching element falls below the first supply voltage potential by the predefined second threshold value.

6. The method as claimed in claim 5, wherein the step of identifying the correct operation of the electrical switching unit also comprises:

determining a first time at which the second semiconductor switching element changes from the activated state into the deactivated state, determining a second time at which the voltage measured on the first semiconductor switching element falls below the first supply voltage potential by the first threshold value, and identifying the correct operation of the electrical switching unit if the second time occurs within a predetermined duration after the first time.

7. The method as claimed in claim 5, wherein the correct operation of the electrical switching unit is identified only if the voltage measured on the first semiconductor switching element falls below the first supply voltage potential by the second threshold value for a pre-defined second minimum duration.

8. The method as claimed in claim 5, further comprising:

allowing a re-activation of the second semiconductor switching element if the correct operation of the electrical switching unit has been identified.

9. A computer program product having at least one non-transitory computer-readable memory medium with program code instructions which are stored thereon and which are executable by a computer, wherein the program code instructions which are executable by a computer are configured to carry out a method as claimed in claim 1.

10. A full bridge circuit for operating an inductive load, comprising:

a first semiconductor switching element for supplying the inductive load with a first supply voltage potential, a second semiconductor switching element for powering the inductive load with a second supply voltage potential, wherein the second supply voltage potential has a lower value compared to the first supply voltage potential and wherein the first semiconductor switching element and the second semiconductor switching element each have a diode, and a control device which is configured to carry out a method as claimed in claim 1.

11. The method as claimed in claim 2, wherein the correct operation of the electrical switching unit is only identified if the voltage measured on the second semiconductor switching element falls below the second supply voltage potential by the first threshold value for a pre-defined first minimum duration.

12. The method as claimed in claim 6, wherein the correct operation of the electrical switching unit is identified only if the voltage measured on the first semiconductor switching element falls below the first supply voltage potential by the second threshold value for a pre-defined second minimum duration.

13. A computer program product having at least one non-transitory computer-readable memory medium with program code instructions which are stored thereon and which are executable by a computer, wherein the program code instructions which are executable by a computer are configured to carry out a method as claimed in claim 5.

14. A full bridge circuit for operating an inductive load, comprising:
- a first semiconductor switching element for supplying the inductive load with a first supply voltage potential,
- a second semiconductor switching element for powering the inductive load with a second supply voltage potential, wherein the second supply voltage potential has a lower value compared to the first supply voltage potential and wherein the first semiconductor switching element and the second semiconductor switching element each have a diode, and
- a control device which is configured to carry out a method as claimed in claim 5.

* * * * *